(12) United States Patent
Pandita

(10) Patent No.: US 11,658,696 B2
(45) Date of Patent: May 23, 2023

(54) NETWORK TRANSCEIVER WITH VGA CHANNEL SPECIFIC EQUALIZATION

(71) Applicant: Microsoft Technology Licensing, LLC, Redmond, WA (US)

(72) Inventor: Bupesh Pandita, Cary, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/204,752

(22) Filed: Mar. 17, 2021

(65) Prior Publication Data

US 2022/0302951 A1 Sep. 22, 2022

(51) Int. Cl.
| | |
|---|---|
| *H04B 1/40* | (2015.01) |
| *H04B 1/04* | (2006.01) |
| *H04B 1/16* | (2006.01) |
| *H04B 14/02* | (2006.01) |
| *H04L 7/02* | (2006.01) |

(Continued)

(52) U.S. Cl.
CPC .............. *H04B 1/40* (2013.01); *H03G 3/3042* (2013.01); *H04B 1/04* (2013.01); *H04B 1/16* (2013.01); *H04B 14/023* (2013.01); *H04L 7/02* (2013.01); *H04L 25/03012* (2013.01);

(Continued)

(58) Field of Classification Search
CPC .............. H04L 25/03; H04L 25/03006; H04L 25/03012; H04L 25/03019; H04L 25/03057; H04L 25/03878; H04L 25/03885; H04L 25/4917; H04L 2025/03363; H04L 7/02; H04B 1/40;

(Continued)

(56) References Cited

U.S. PATENT DOCUMENTS

| | | | |
|---|---|---|---|
| 8,363,683 B2* | 1/2013 | Agazzi | H04L 25/03006 375/371 |
| 11,218,225 B1* | 1/2022 | Alnabulsi | H04L 25/03019 |

(Continued)

OTHER PUBLICATIONS

Agazzi, et al., "Background Calibration of Interleaved Analog to Digital Converters for High-Speed Communications Using Interleaved Timing Recovery Techniques", In Journal of IEEE International Symposium on Circuits and Systems, May 23, 2005, pp. 1390-1393.

(Continued)

*Primary Examiner* — Betsy Deppe
(74) *Attorney, Agent, or Firm* — Alleman Hall Creasman & Tuttle LLP

(57) ABSTRACT

A network transceiver device is provided, including at least two variable gain amplifiers (VGAs), and at least two sets of analog digital converters (ADCs), each set including ADCs coupled to an output of one of the VGAs, the sets being arranged in VGA-specific channels. The device includes a plurality of feed-forward equalizers (FFEs), each FFE being coupled to receive an output of one of the ADCs in one of the VGA-specific channels. Each FFE is configured to adaptively equalize the output received from the ADCs utilizing a first equalization coefficient subset with coefficient values that are common to all FFEs, and a second equalization coefficient subset that is channel specific and that has a first set of coefficient values for a first VGA-specific channel and a second set of coefficient values for a second VGA-specific channel, the sets of coefficient values being computed independently.

17 Claims, 12 Drawing Sheets

(51) Int. Cl.
*H04L 25/03* (2006.01)
*H03G 3/30* (2006.01)
*H04W 52/52* (2009.01)

(52) U.S. Cl.
CPC .. *H04L 25/03019* (2013.01); *H04L 25/03057* (2013.01); *H04W 52/52* (2013.01); *H04B 2001/0433* (2013.01)

(58) Field of Classification Search
CPC .......... H04B 1/16; H04B 14/023; H04B 3/00; H04B 3/02
See application file for complete search history.

(56) References Cited

U.S. PATENT DOCUMENTS

2007/0133719 A1    6/2007    Agazzi et al.
2017/0257168 A1    9/2017    Gopalakrishnan et al.

OTHER PUBLICATIONS

Eyuboglu, et al., "Reduced-State Sequence Estimation with Set Partitioning and Decision Feedback", In Journal of IEEE Transactions on Communications, vol. 36, Issue 1, Jan. 1988, pp. 13-20.

Forney, Jr, G. David, "The Viterbi Algorithm", In Proceedings of the IEEE, vol. 61, Issue 3, Mar. 1973, pp. 268-278.

Luna, et al., "Compensation of Track and Hold Frequency Response Mismatches in Interleaved Analog to Digital Converters for High-Speed Communications", In Proceedings of the IEEE International Symposium on Circuits and Systems, May 24, 2006, pp. 1631-1634.

Parhi, Keshabk., "Design of Multigigabit Multiplexer-Loop-Based Decision Feedback Equalizers", In Journal of IEEE Transactions on Very Large Scale Integration (VLSI) Systems, vol. 13, Issue 4, Apr. 4, 2005, pp. 489-493.

Tsai, et al., "Correction of Mismatches in a Time-Interleaved Analog-to-Digital Converter in an Adaptively Equalized Digital Communication Receiver", In Journal of IEEE Transactions on Circuits and Systems I: Regular Papers, vol. 56, Issue 2, Feb. 2009, pp. 307-319.

Ungerboeck, Gottfried, "Channel Coding with Multilevel/Phase Signals", In Journal of IEEE Transactions on Information Theory, vol. 28, Issue 1, Jan. 1982, pp. 55-67.

Winters, et al., "Electrical Signal Processing Techniques in Long-Haul Fiber-optic Systems", In Journal of IEEE Transactions on Communications, vol. 38, Issue 9, Sep. 1990, pp. 1439-1453.

Yueksel, et al., "Design Considerations on Sliding-Block Viterbi Detectors for High-Speed Data Transmission", In Proceedings of the 10th International Conference on Signal Processing and Communication Systems, Dec. 19, 2016, 6 Pages.

Yueksel, et al., "Design Techniques for High-Speed Multi-Level Viterbi Detectors and Trellis-Coded-Modulation Decoders", In Journal of IEEE Transactions on Circuits and Systems I: Regular Papers, vol. 65, Issue 10, Oct. 2018, pp. 3529-3542.

Palermo, Samuel, "ADC-Based Serial Links: Design and Analysis", In Proceedings of the IEEE International Solid-State Circuits Conference, Feb. 11, 2018, 71 Pages.

"International Search Report and Written Opinion Issued in PCT Application No. PCT/US22/018818", dated Jun. 15, 2022, 13 Pages.

Rao, et al., "Correcting the Effects of Mismatches in Time-Interleaved Analog Adaptive FIR Equalizers", In Journal of IEEE Transactions on Circuits and Systems I: Regular Papers, vol. 59, Issue 11, Nov. 2012, pp. 2529-2542.

\* cited by examiner

NETWORK TRANSCEIVER WITH VGA CHANNEL SPECIFIC EQUALIZATION

BACKGROUND

Modern computing infrastructure includes a variety of network connected devices such as servers, routers, switches in data centers and end-user computer devices, tablets, and smartphones that connect to these data centers via local area and wide area networks. These connected devices involve high speed transmission of large amounts of data in near real time. The demand for speed and efficiency has increased dramatically within recent years, and data transmission rates have seen a steady climb. Ethernet has been the standard method of connecting these computers and devices on a network that requires high speed transmission. Pulse Amplitude Modulation (PAM) technique has been used for high speed transmission. Pulse Amplitude Modulation-4 (PAM-4), which is a four-level modulation scheme, has been adopted for achieving a higher data rate in some Ethernet networks.

SUMMARY

According to one aspect of the present disclosure, a network transceiver device is provided, including at least two variable gain amplifiers (VGAs) configured to amplify received signals, and at least two sets of analog digital converters (ADCs), each set including a plurality of ADCs coupled to a respective output of a corresponding one of the plurality of VGAs, the sets of ADCs being arranged in at least a first VGA-specific channel and at least a second VGA-specific channel. The network transceiver device may further include a plurality of feed-forward equalizers (FFEs), each FFE being coupled to receive a respective output of a corresponding one of the plurality of ADCs in either the first VGA-specific channel or the second VGA-specific channel, each FFE being configured to adaptively equalize the output of received from the corresponding one of the ADCs utilizing a plurality of equalization coefficients, the equalization coefficients including a first equalization coefficient subset with coefficient values that are common all FFEs, and a second equalization coefficient subset that is channel specific and that has a first set of coefficient values for the first VGA-specific channel and a second set of coefficient values for the second VGA-specific channel, the first and second set of coefficient values being computed independently of each other.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

As discussed above, the connected computers and devices in modern computing infrastructure often utilize high speed transmission of large amounts of data in near real time. Computer network speeds have evolved significantly over time, rising from 10 Mbps for connecting local computers to more than 40 Gbps for connecting servers, switches, and routers in data centers. Challenges exist to achieving even higher data rates for such network transmissions. For example, at the physical link level of the Open Systems Interconnect (OSI) model, communications hardware such as a transmission medium (e.g., copper or fiber cables, wireless, etc.) and connectors such as network transceivers operate to transfer data symbols between endpoint devices. It is difficult for conventional network transceivers to operate at such high data transmission rates. Some modern network transceivers include variable gain amplifiers (VGAs) coupled to analog digital converters (ADCs). Physical limitations on the conversion rates of the ADCs in such network transceivers limit the maximum achievable data transfer rate for each ADC.

Figure 1:
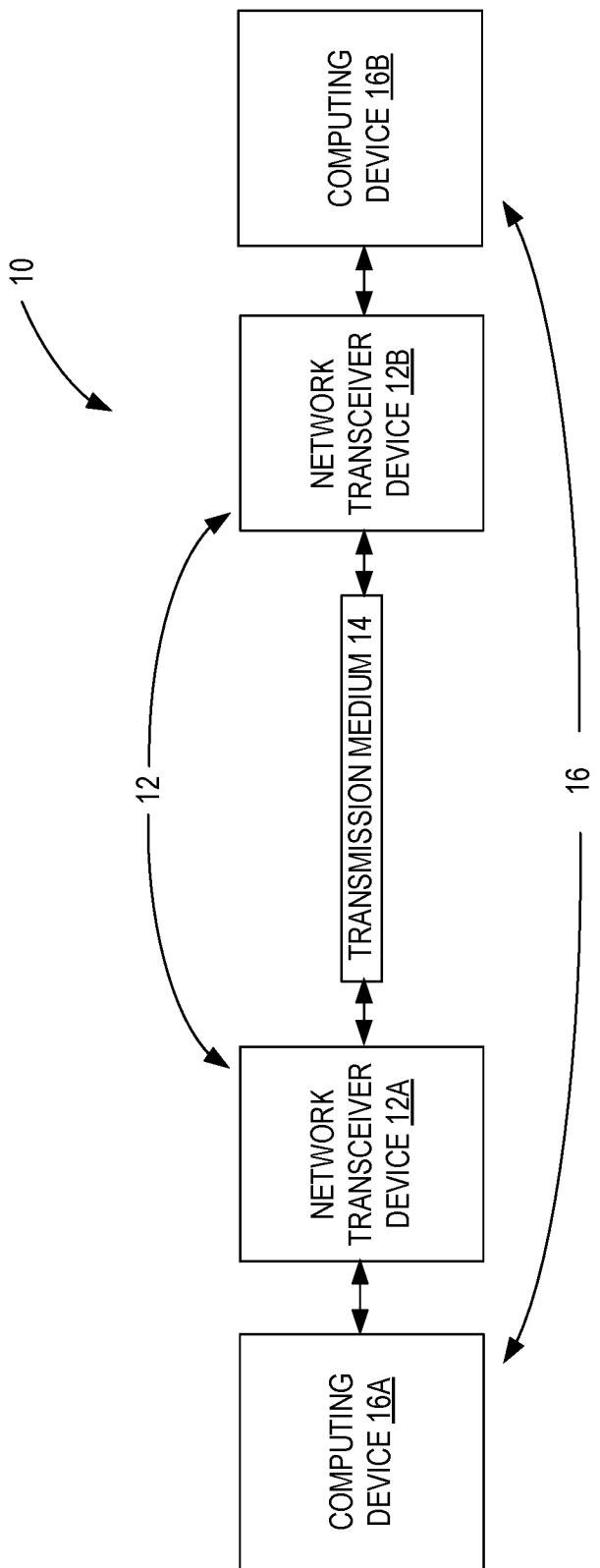
FIG. 1 shows a schematic view of a computing system that includes a plurality of network transceiver devices configured to transmit data between computing devices over a transmission medium, according to one example of the present disclosure.

To address these issues, a network transceiver device and signal processing method for use therewith are disclosed herein. FIG. 1 shows a system 10 including a network transceiver device 12 according to one aspect of the present disclosure that transmits and receives communications over a transmission medium 14 with one or more computing devices 16. In the depicted configuration, a first computing device 16A communicates via a first network transceiver device 12A via the transmission medium 14 and second network transceiver device 12B to transmit and receive data to and from second computing device 16B. Computing devices 16 may be any of a variety of types of computing devices, such as laptop, desktop, server, or network appliance such as an application delivery controller, load balancer, switch, etc. Computing devices 16 may also be mobile computing devices such as a handheld tablet or smartphone device. The transmission medium may be a conductive wire such as a copper cable, an optical transmission device such as an optical fiber. One form factor in which the network transceiver device may be provided is a network interface card such as a Peripheral Component Interconnect (PCI) ethernet adapter network interface card. The network transceiver device 12 may be configured to operate as a four-level pulse-amplitude modulated (PAM-4) transceiver.

Figure 2:
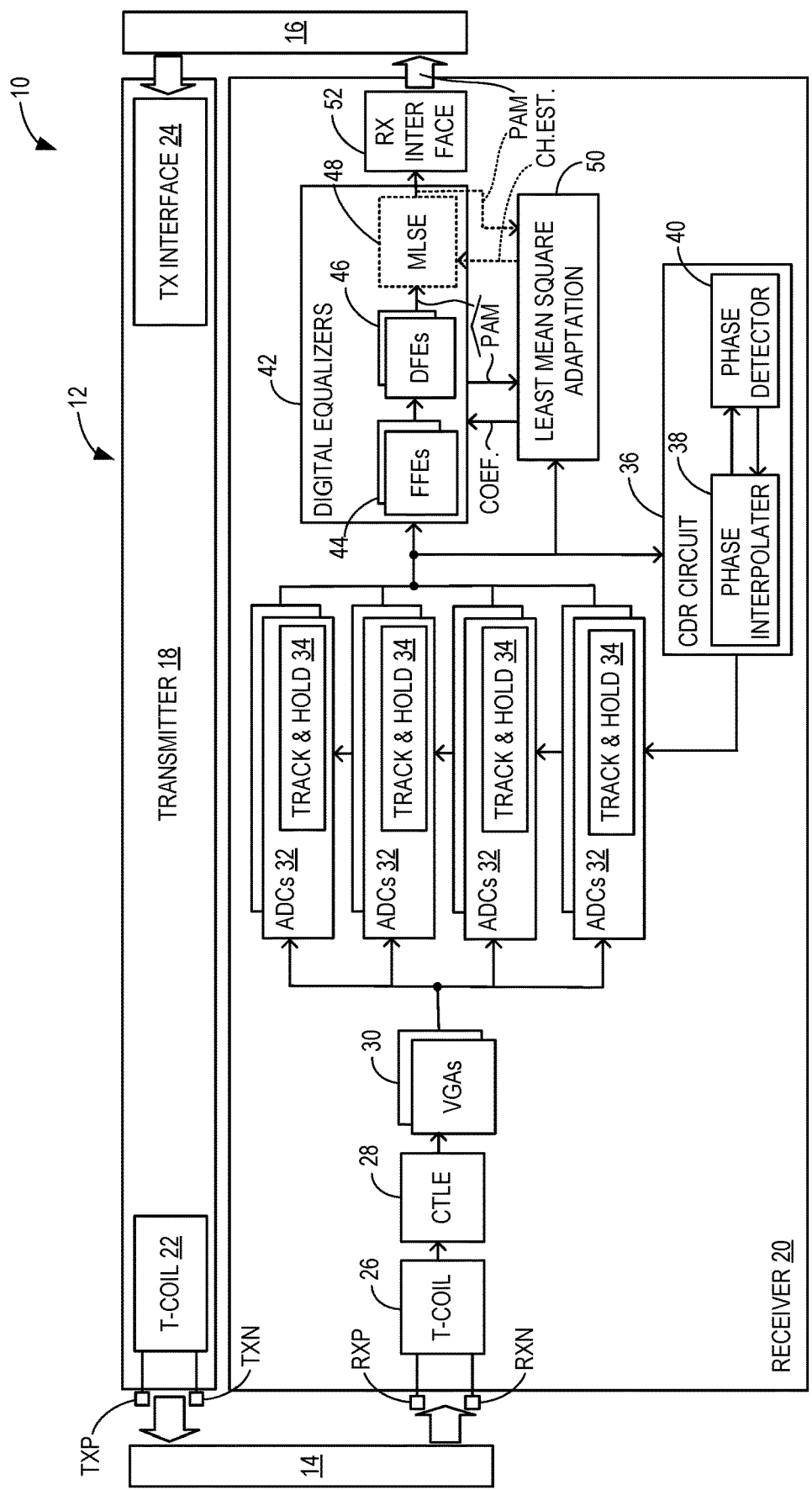
FIG. 2 shows a schematic view of an example network transceiver device of the system of FIG. 1, which includes a transmitter and receiver.

Turning now to FIG. 2, the network transceiver device 12 may include a transmitter 18 configured to transmit, and a receiver 20 configured to receive, communications sent over the transmission medium 14. Each of the transmitter 18 and receiver 20 are connected to terminals that connect to the transmission medium 14 to send and receive signals over the transmission medium 14. Two of these terminals are labeled TXP and TXN, and are differential serial output signals, while the other two are labeled RXP and RXN, and are differential serial input signals. The TXP, TXN, RXP and RXN signals interface to the transmission medium 14. Conversely, each of the transmitter 18 and receiver 20 also have respective interfaces, namely the TX interface 24 and the RX interface 52, which are configured to interface with the computing devices 16. Typically, these interfaces operate over interconnects or circuitry on a network interface card. Thus, the computer devices 16 may be integrated in a same housing H with the network transceiver device 12.

The transmitter 18 transmits signals over the transmission medium 14, and the signals are received by a T-Coil 26 at the receiver 20. The T-Coil 26 includes inductors used for impedance matching and reduction of input return-loss. A diode for electrostatic discharge (ESD) protection is also included with the T-Coil 26. After the T-Coil 26, the signals go through a continuous time linear equalizer (CTLE) 28, which is a linear filter applied at a receiver that attenuates low-frequency signal components and amplifies high-frequency signal components and compensate high-frequency losses introduced by the transmission medium 14. The CTLE 28 is implemented on the input side of the receiver 20 to perform linear equalization in the analog domain before analog-to-digital conversion, which is described below. In the depicted configuration, one CTLE 28 is provided, which has the benefit of minimizing power consumption for the analog equalization, since CTLE consumes significant power at high transmission rates. However, in other configurations it will be appreciated that more than one CTLE can be installed in the receiver 20.

The network transceiver device 12 further may include at least two variable gain amplifiers (VGAs) 30 configured to amplify received signals. The VGAs 30 are configured to receive equalized output from the CTLE 28. Each VGA 30 is an electronic amplifier that varies its gain depending on a control voltage. The VGAs 30 can be used to amplify low amplitude signals and attenuate high amplitude signals, as desired. The VGAs 30 may be placed before ADCs 32 to adjust gain of the equalized signals to lie within a dynamic range of each of the ADCs 32 before the gain-adjusted equalized signals are supplied to the ADCs 32. To achieve a high transmission rate, such as 112 Gbps, a fanout architecture is utilized. Thus, in one example embodiment, two VGAs 30 are provided, and the two VGAs 30 fan out to 64 interleaved ADCs 32, although other numbers and ratios of VGAs and ADCs may be provided. In one example, four sets of ADCs are included, with 16 ADCs included in each of the four sets. The interconnection of the VGAs 30 to the ADCs 32 will be described below. Each ADC 32 includes a track and hold circuit 34. Each track and hold circuit 34 tracks input signals to each ADC 32 and holds a fixed amplitude while conversion by each ADC 32 is in process. Each track and hold circuit 34 holds the incoming analog signals from the VGAs 30 and each ADC 32 generates digital signals from the analog signals based on a sampling clock generated by a clock data recovery (CDR) circuit 36, which is described below. The CDR circuit 36 includes a phase detector 40 and phase interpolator 38. The CDR circuit 36 receives digital data from the ADCs 32, extracts clock data from the received signal, and generates a sample clock signal, which is transmitted to the ADCs 32. The details of the function of the CDR circuit 36 are described below.

The network transceiver device 12 further may include digital equalizers 42 such as feed-forward equalizers (FFEs) 44 and decision feedback equalizers (DFEs) 46. The FFE 44 utilizes a digital finite impulse response filter (FIR) to compensate for pre-cursor and post-cursor inter-symbol interference (ISI). The DFE 46 is a nonlinear equalizer that uses previous detector decision to eliminate an inter-symbol interference (ISI) on pulses that are currently being demodulated. The FFEs 44 and DFEs 46 are configured to adaptively equalize outputs received from the ADCs 32. Further, in some configurations, the network transceiver device 12 may further include a maximum likelihood sequence estimation (MLSE) equalizer 48. The MLSE equalizer 48 utilizes a Viterbi algorithm to detect the presence of inter-symbol interference (ISI) and noise. The MLSE equalizer is coupled on output side of the plurality of the DFEs, and is configured to correct DFE burst errors in each of the plurality of DFEs, upon detection of the occurrence such burst errors.

The digital equalizers 42 receive digital data from the ADCs 32, receive coefficient values from a least mean square adaptation module 50, serially perform equalization in the digital domain on the output of the ADCs based on the coefficients, and output the equalized digital data to an RX interface 52. The equalized digital data is represented as PAM (HAT) after output by the DFE 46, and PAM when output in final form after the MLSE equalizer 48 (when included) to the RX interface. It will be appreciated that the values of PAM (HAT) and PAM are returned to the least means square adaptation value for use in a subsequent time step. The equalized digital data PAM is transmitted via the RX interface 52 to the computing device 16B. The equalized digital data PAM represents one of the four PAM signal states 0, 1, 2, or 3. Additional details of the function of each digital equalizer are described below.

Figure 3:
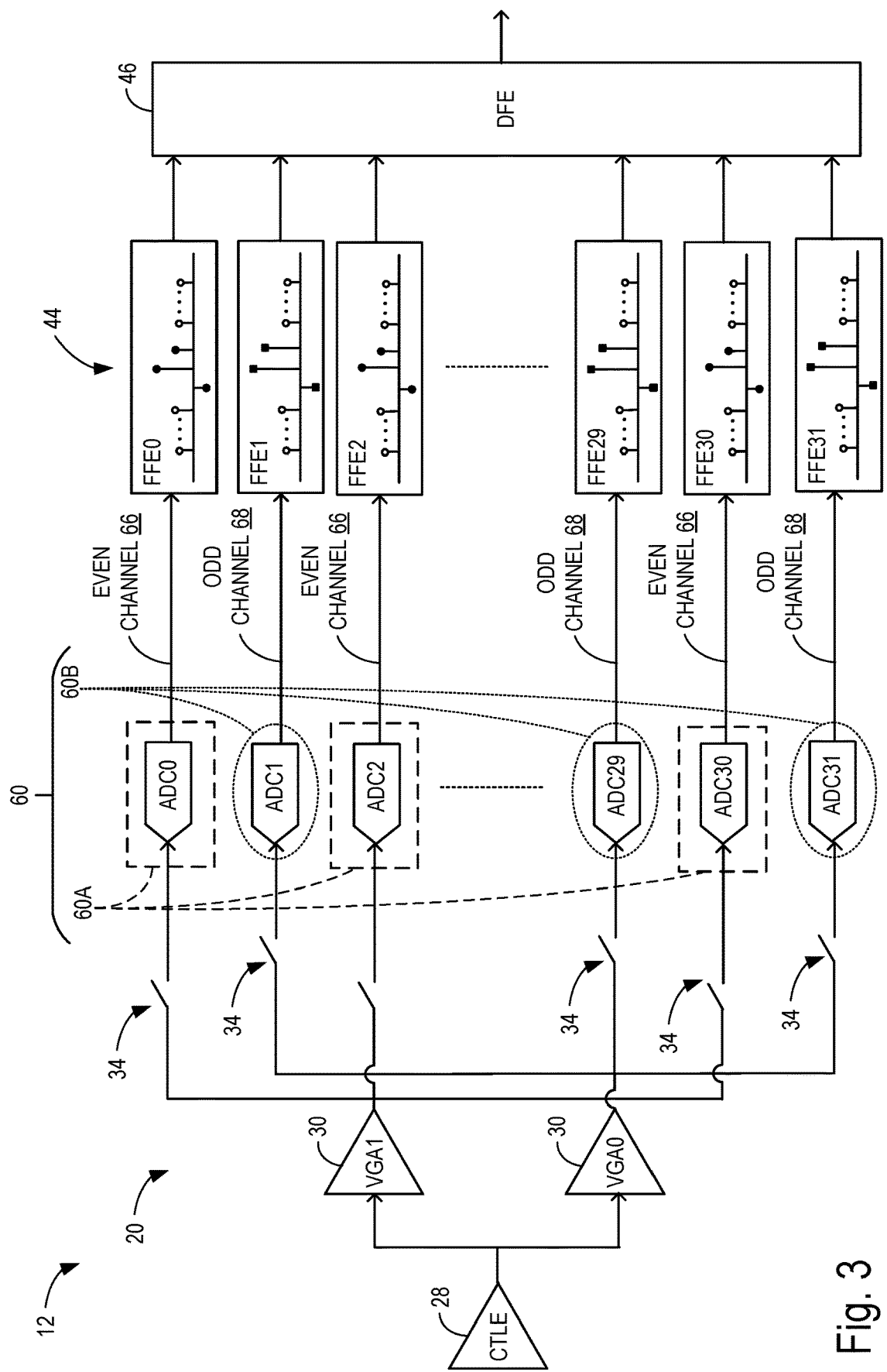
FIG. 3 schematically shows an example receiver of the network transceiver device of the system of FIG. 1, in which a plurality of ADCs and a plurality of FFEs are arranged in one or more VGA-specific channels.

Turning to FIG. 3, the network transceiver device 12 further includes at least two sets 60 of analog digital converters (ADCs) 32, including a first ADC set 60A and a second ADC set 60B. Each set 60 includes a plurality of ADCs 32 coupled to a respective output of a corresponding one of the plurality of VGAs 30. The sets 60 of ADCs 32 are arranged in at least one first VGA-specific channel 66 and at least one second VGA-specific channel 68. It will be appreciated that the first VGA-specific channel 66 may be referred to as an even channel since it contains even numbered ADCs and the second VGA-specific channel 68 may be referred to as an odd channel since it contains odd numbered ADCs, the even and odd numbered ADCs being interleaved in a sampling sequence as discussed below. In the depicted embodiment, sixteen even channels 66 in the first ADC set 60A and sixteen odd channels 68 are provided in the second ADC set 60B of the ADCs 32, although other configurations are possible. The VGAs 30 provide signals to the track and hold circuits 34, which output at an appropriate timing signals to each of the ADCs 32, which in turn convert the analog signals into digital signals. Each ADC 32 is operated based on a different phase of the sampling clock generated from the CDR circuit 36 as described below.

It will be appreciated that, by installing multiple VGAs and multiple ADCs in a network transceiver device, parallelism can be achieved that enables a higher overall data transmission rate and overcomes the individual conversion rate limitation of each ADC. For example, even if a single ADC is limited to 875 MHz, a throughout of 112 Gbps (or 56 Gbps symbol transfer rate) can be realized by using a fanout to 64 ADCs from 2 VGAs. However, adopting such a fanout architecture that utilizes a plurality VGAs can create other challenges, such as VGA gain mismatch and bandwidth mismatch.

As illustrated, the network transceiver device 12 further includes the plurality of FFEs 44, each of which is coupled to receive a respective output of a corresponding one of the plurality of ADCs 32 in either an even channel or an odd channel. Each FFE 44 is configured to adaptively equalize the output received from the corresponding one of the ADCs 32. The receiver 20 employs the plurality of FFEs 44 to equalize digital signals received from the plurality of ADCs 32. Each FFE 44 utilizes a digital finite impulse response filter (FIR) to compensate for pre-cursor and post-cursor inter-symbol interference (ISI). Each FFE 44 generates delayed versions of the input signal that are added back to the signal with proper weights known as equalization coefficients. To address the gain and bandwidth mismatch challenges described above, the network transceiver device 12 utilizes an FFE architecture that computes some FFE equalization coefficients independently for each VGA channel, and commonly for other FFE equalization coefficients, as further described below in relation to FIG. 4A. Thus, each FFE utilizes one or more VGA-specific channel equalization coefficients during equalization. It will be appreciated that the first set of coefficient values and second set of coefficient values typically differ in value from each other when computed in this manner.

Figure 4A:
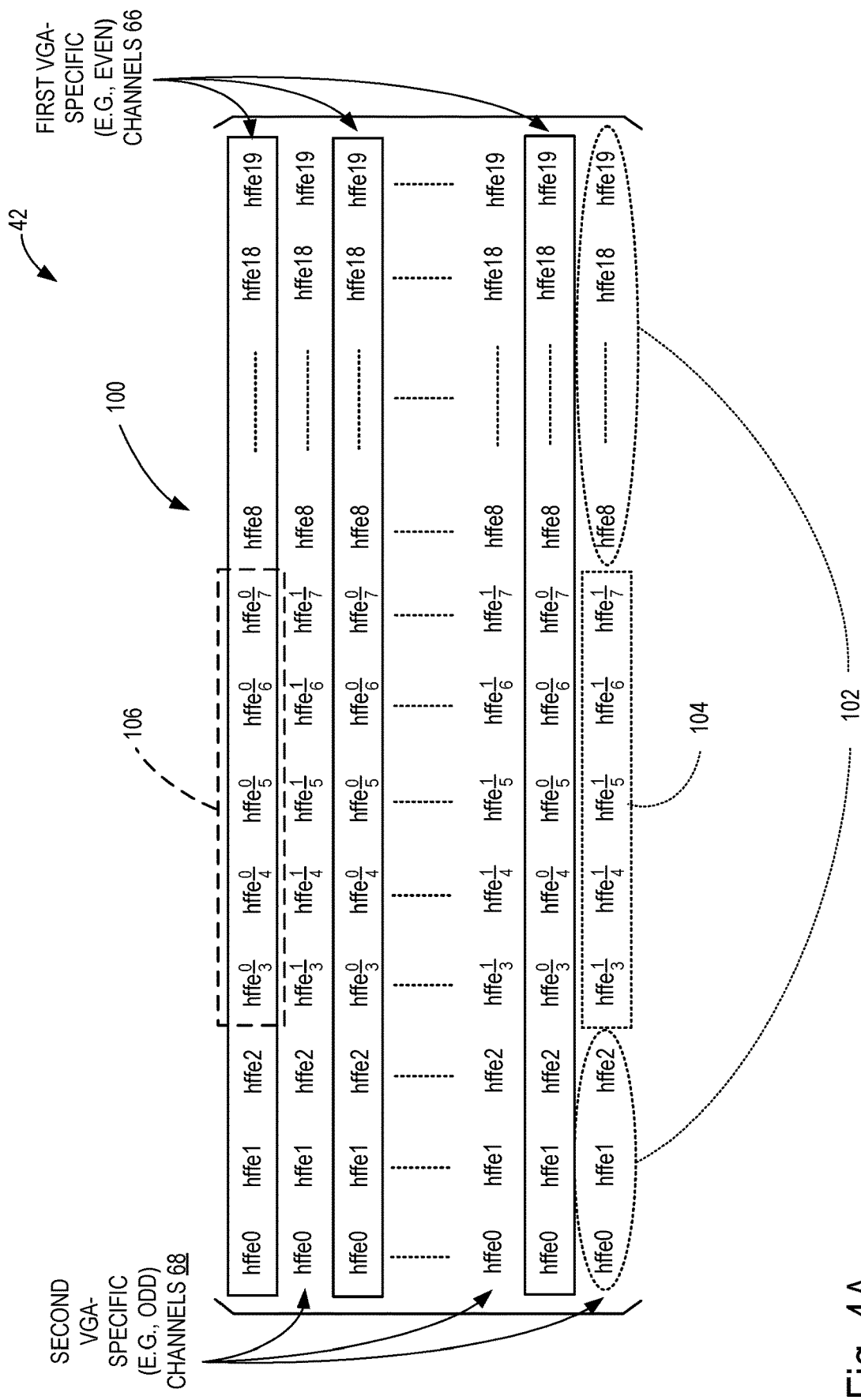
FIG. 4A schematically shows FFE coefficients for the VGA-specific channels of the receiver of FIG. 3.

Turning now to FIG. 4A, each FFE 44 may be configured to adaptively equalize the output received from the corresponding one of the ADCs 32 utilizing a plurality of equalization coefficients 100. The equalization coefficients 100 include a first equalization coefficient subset 102 with coefficient values that are common to all FFEs 44, and a second equalization coefficient subset 104 that is channel specific and that has a first set 104 of coefficient values for the odd channel and a second set 106 of coefficient values for the even channel. The first and second set of coefficient values are computed independently of each other as described below.

In the depicted configuration as described in FIG. 3, two VGAs 30, a plurality of ADCs 32 coupled to each VGA 30, and a plurality of FFEs 44 respectively coupled to each ADC, are employed. Each FFE 44 may be implemented with multiple tap filters and multiple tap coefficients, with the FFE taps including a main cursor, as well as pre-cursor and post-cursor taps. In the depicted configuration, the FFEs 44 are implemented with twenty taps and twenty coefficients, with the taps including five pre-cursors and fourteen post-cursors. Other tap variations are possible. In an architecture that employs only one VGA, it will be appreciated that the same coefficient values would be applied for all channels. However, the use of a plurality of VGAs 30 in network transceiver device 12 causes VGA gain mismatch and bandwidth mismatch to be introduced, as discussed above. To address these mismatch challenges when two VGAs are used as illustrated, two sets of coefficients, one for the odd channels and one for the even channels, are created as described in relation to FIG. 4A. The values of the coefficients between these two sets are the same except for the coefficients of the pre-cursor, main cursor, and post-cursor. In the depicted configuration, the values of the five coefficients of the pre-cursor, main cursor and post-cursor are different. The coefficient values 104, 106 of the pre-cursor, main cursor, and post-cursor for the odd and even channels are computed independently of each other. Additional coefficients can be changed in the pre-cursors and post-cursors of the odd and even channels to improve the correction of the VGA gain and bandwidth mismatches. Further, in implementations in which more than two VGAs are provided, it will be appreciated that more than two channels will be created, and in such implementations a set of coefficients will be generated for each channel corresponding to each VGA. Thus, if four VGAs are provided, four coefficient sets would be generated corresponding to four different ADC subsets. In such embodiments, these additional VGA-specific channels may be referred to as a third, fourth, etc. VGA-specific channels.

The sets of coefficients can be generated using the following techniques. The first and second sets of coefficient values can be computed to minimize a squared error associated with an ADC sample of analog input signal. For example, the squared error may be computed based on the following:

$$e_k^2 = \left[ EQTARG[d_k] - \left( \sum_{m=0}^{nffe} hffe_m ADC_{k-m} - \sum_{i=1}^{m} hdfe_j d_{k-1} \right) \right]^2$$

In the above equation:
  $hffe_m$ is an FFE coefficient;
  $hdfe_i$ is a DFE coefficient;
  $ADC_k$ is a $k^{th}$ ADC sample (i.e., a current sample from a current time step);
  $ADC_{k-m}$ is an ADC sample corresponding to (k-m)th input signal sample;
  $EQTARG[d_k]$ is an equalization target for the FFE equalization corresponding to one of the four PAM levels;
  $d_k$ is an output of the DFE data slicer at time interval k;
  $d_{k-i}$ is an output of the DFE data slicer at time interval k-i;
  m is an index of FFE coefficients; and
  n is a number of DFE taps.

Figure 4B:
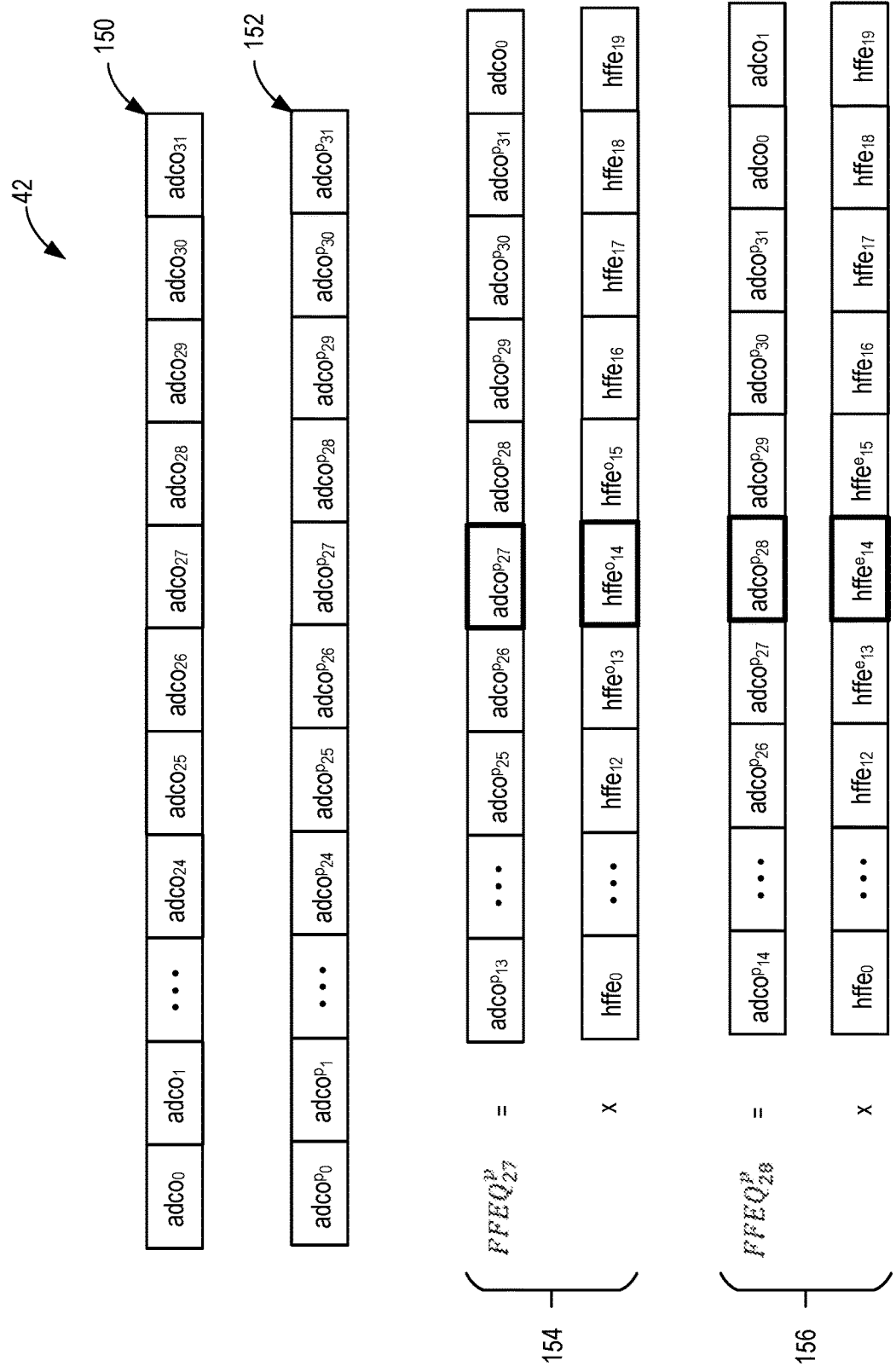
FIG. 4B schematically shows ADC buses and FFE coefficients for the VGA-specific channels of the receiver of FIG. 3.

In the depicted configuration as described in FIG. 4B, a first ADC bus 150 from a current timestep n, and second ADC bus 152 from a prior time step n−1 are stored and made accessible to the FFEs 44. Each ADC bus 150, 152 contains an array of ADC values from the respective time step. While arrays of 32 values are shown, other sized buses may be utilized. In FIG. 4B $adco_0$ refers to the output of the ADC zero at timestep n, and $adco^p$ refers to the output of ADC zero at the "previous" timestep n−1, and so forth. In this example, the FFEs 44 are implemented with twenty taps and twenty coefficients, organized into two sets of coefficients, one for the odd channels and one for the even channels. The values of the coefficients between these two sets are the same except for the coefficients of the pre-cursor, main cursor, and post-cursor in this example. In the depicted configuration, the values of the three coefficients of the pre-cursor, main cursor and post-cursor are different, and are labeled with "o" for odd channel coefficients and "e" for even channel coefficients. In FIG. 4B, $hffe_{13}^o$, $hffe_{14}^o$, and $hffe_{15}^o$ are the coefficients of the pre-cursor, main cursor, and post-cursor for the odd channels, while $hffe_{13}^e$, $hffe_{14}^e$, and $hffe_{15}^e$ in FIG. 4B are the coefficients of the pre-cursor, main cursor, and post-cursor for the even channels. The values of $hffe_{13}^o$, $hffe_{14}^o$, and $hffe_{15}^o$ are computed independently from those of $hffe_{13}^e$, $hffe_{14}^e$, and $hffe_{15}^e$.

FFE equalized outputs FFEQ may be generated by multiplying ADC samples with FFE coefficients. For example, equalized output $FFEQ_{27}^p$ corresponding to $adco_{27}^p$ which corresponds to an odd channel may be computed by a first matrix multiplication 154 in FIG. 4B, which it will be appreciated multiplies the upper array by the lower array within the brackets of 154. Equalized output $FFEQ_{28}^p$ corresponding to $adco_{28}^p$ which corresponds to an even channel may be computed by a second matrix multiplication 156 in FIG. 4B, which it will be appreciated multiplies the upper array by the lower array within the brackets of 156. In FIG. 4B, $hffe_{14}^o$ and $hffe_{14}^e$ correspond to FFE coefficients for the main cursor in the odd and even VGA-specific channels, respectively. The DFE 46 compensates for a first tap post-cursor (assuming that one DFE tap at first post-cursor is used) and generates the equalized output. For example, the equalized output corresponding to $adco_{27}^p$ may be computed as follows.

$$EQ_{27}^p = FFEQ_{27}^p - hdfe * d_{26}^p$$

Similarly, the equalized output for $adco_{28}^p$ may be computed as follows.

$$EQ_{28}^p = FFEQ_{28}^p - hdfe * d_{27}^p$$

In these equations, hdfe is a DFE coefficient and "d" represents a DFE slicer decision for the equalized output, i.e., positive or negative 1. The error for each equalized output may be computed. For example, the error corresponding to $adco_{27}^p$ may be computed as follows.

$$Err_{27}^p = EQTARG_{27}^p - (FFEQ_{27}^p - hdfe * d_{26}^p)$$

The error corresponding to $adco_{28}^p$ may be computed as follows.

$$Err_{28}^p = EQTARG_{28}^p - (FFEQ_{28}^p - hdfe * d_{27}^p)$$

Similarly, a set of thirty-two errors for thirty-two ADCs 32 are generated as follows.

$$[Err_{27}^p, Err_{28}^p, Err_{29}^p, Err_{30}^p, Err_{31}^p, Err_0, Err_1, \ldots, Err_{26}]$$

Based on this error set, the following three sets of errors (err, $err_o$, and $err_e$) are generated.

$$err = Err_{27}^p + Err_{28}^p + Err_{29}^p + Err_{30}^p + Err_{31}^p + Err_0 + \ldots + Err_{26}$$

$$err_o = Err_{27}^p + Err_{29}^p + Err_{31}^p + Err_1 + \ldots + Err_{25}$$

$$err_e = Err_{28}^p + Err_{30}^p + Err_0 + Err_2 + \ldots + Err_{26}$$

It will be appreciated that "err" is used by the least mean square adaptation module 50 to compute and adapt all FFE coefficients except $hffe_{13}$, $hffe_{14}$, and $hffe_{15}$. Similarly, "$err_o$" is used to compute and adapt $hffe_{13}^o$, $hffe_{14}^o$, and $hffe_{15}^o$ for an odd channel, and "$err_e$" is used to compute and adapt $hffe_{13}^e$, $hffe_{14}^e$, and $hffe_{15}^e$ for an even channel. While in this example three coefficients are independently computed for even and odd channels, it will be appreciated that another number of such coefficients may be independently computed. And, while odd and even channel examples are used, these should be understood to be VGA-specific channels, as more than two VGA-specific channels may be used in some configurations.

Figure 5:
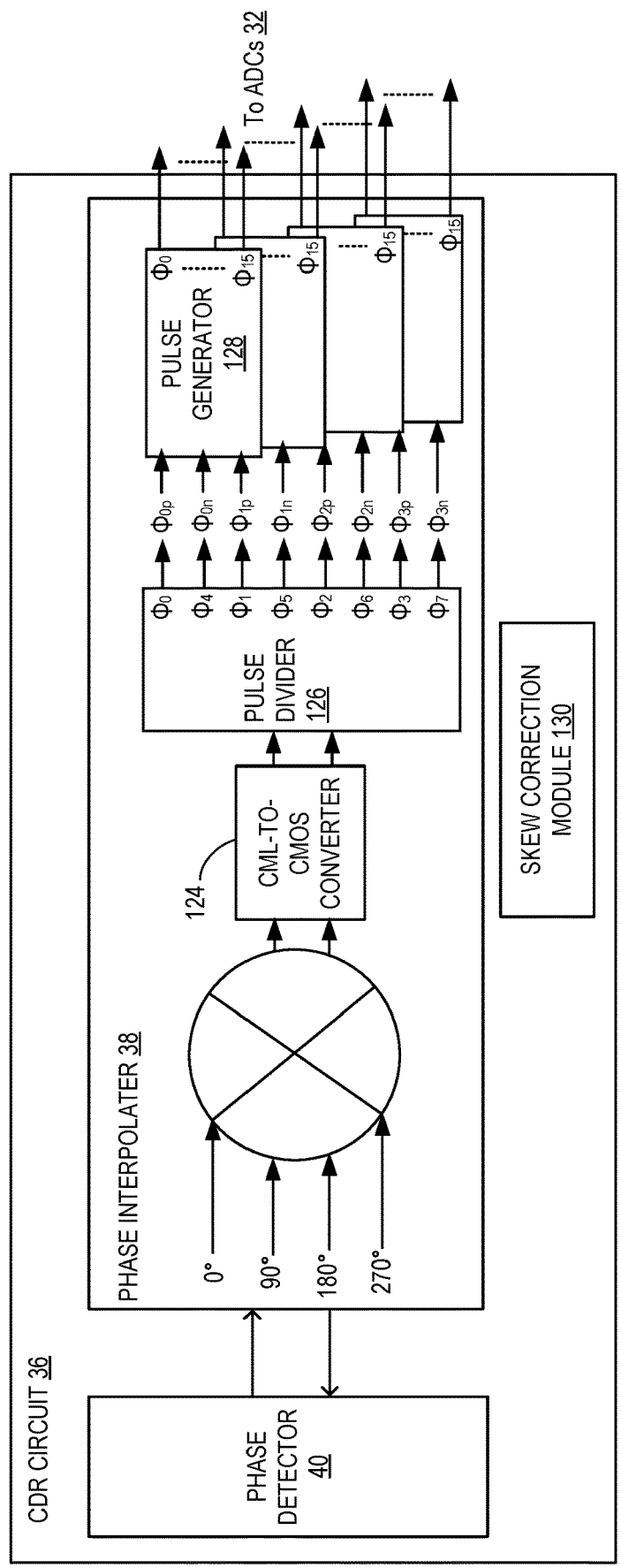
FIG. 5 schematically shows an example CDR circuit of the network transceiver device of FIG. 2.

As discussed above briefly in relation to FIG. 2, the network transceiver device 12 further includes the CDR circuit 36 coupled on an input side and output side of the plurality of the ADCs 32. As shown in detail in FIG. 5, the CDR circuit 36 includes a phase detector 40 configured to detect a phase of a signal received from each of the ADCs 32. The phase detector 40 of the CDR circuit 36 is configured to determine a timing of an impulse response in the received signal from the ADC 32 utilizing at least two precursor coefficients, a main coefficient, and at least two post cursor coefficients. The phase detector 40 compares the phase between input data and a recovered sampling clock data and generates up and down signals based on the phase difference between the input data and the clock data and provides information to a phase interpolator 38 to adjust the sampling clock's phase. The phase interpolator 38 is configured to generate a recovery clock signal by controlling a phase of a reference clock signal based on the phase information provided by the phase detector 40. The phase interpolator 38 outputs signals to a CML-to-CMOS converter 124 which converts a limited swing signal to a full swing CMOS signal, suitable for use with standard CMOS logic. Multiple sample clock signals are generated utilizing a pulse divider 126 and pulse generator 128 and supplied to the ADCs 32. In the depicted embodiment, the CDR circuit 36 generates sixty-four clock pulses for the 64 ADCs 32.

Figure 7:
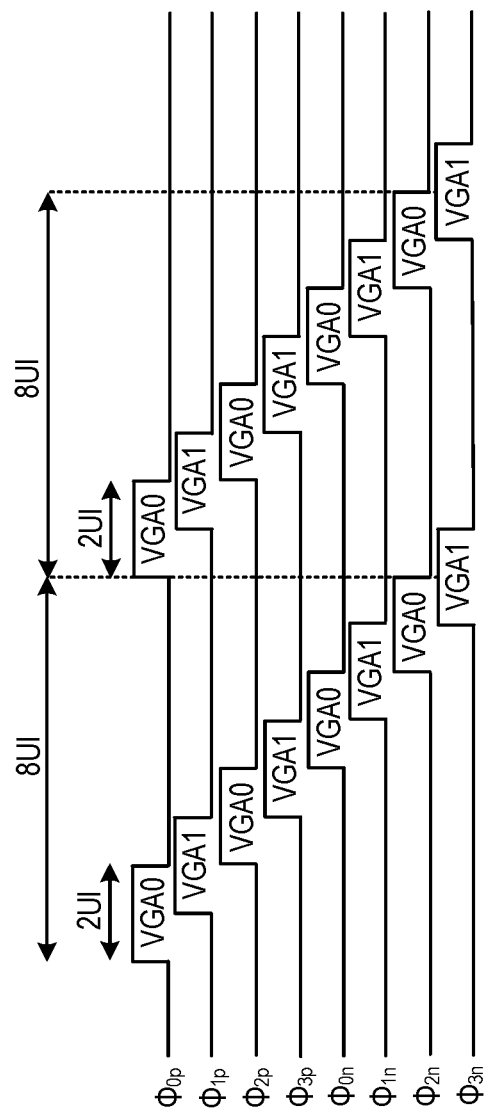
FIG. 7 schematically shows an example of clock pulses that are generated by the CDR circuit of FIG. 2 and used in timing of the VGAs of the network transceiver device.
Figure 8:
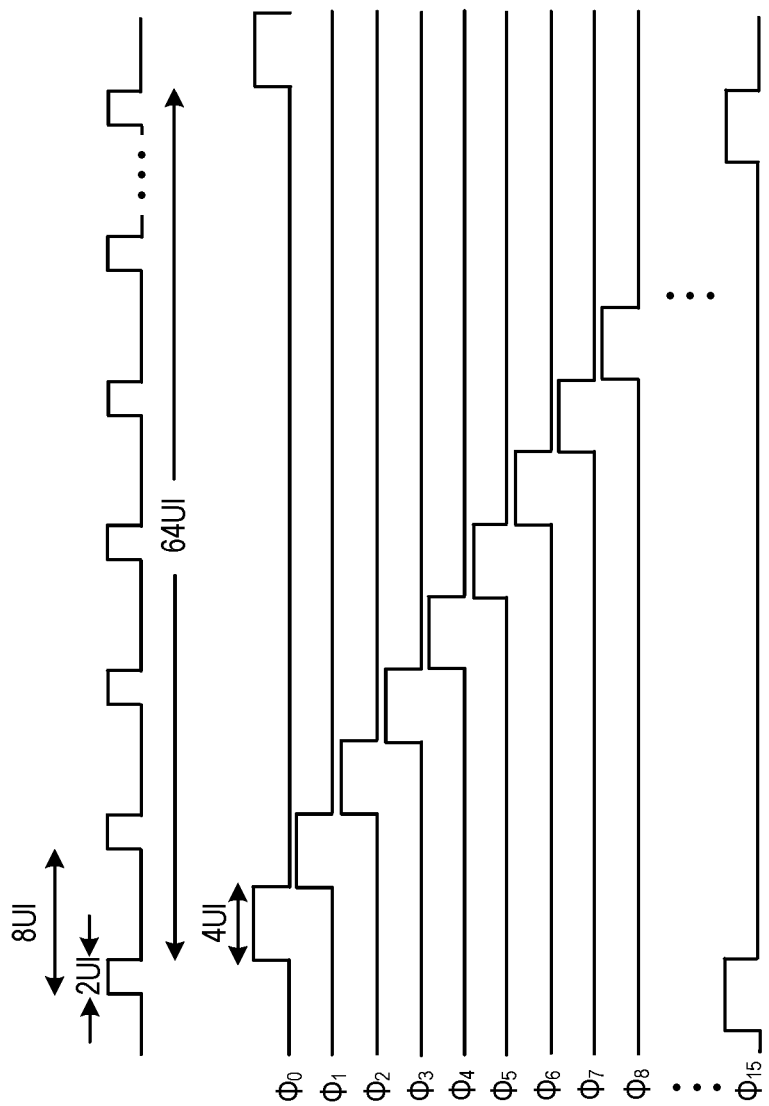
FIG. 8 schematically shows an example of the clock pulses generated by the CDR circuit of FIG. 2, which are used for the timing of ADCs in the network transceiver device.
Figure 9:
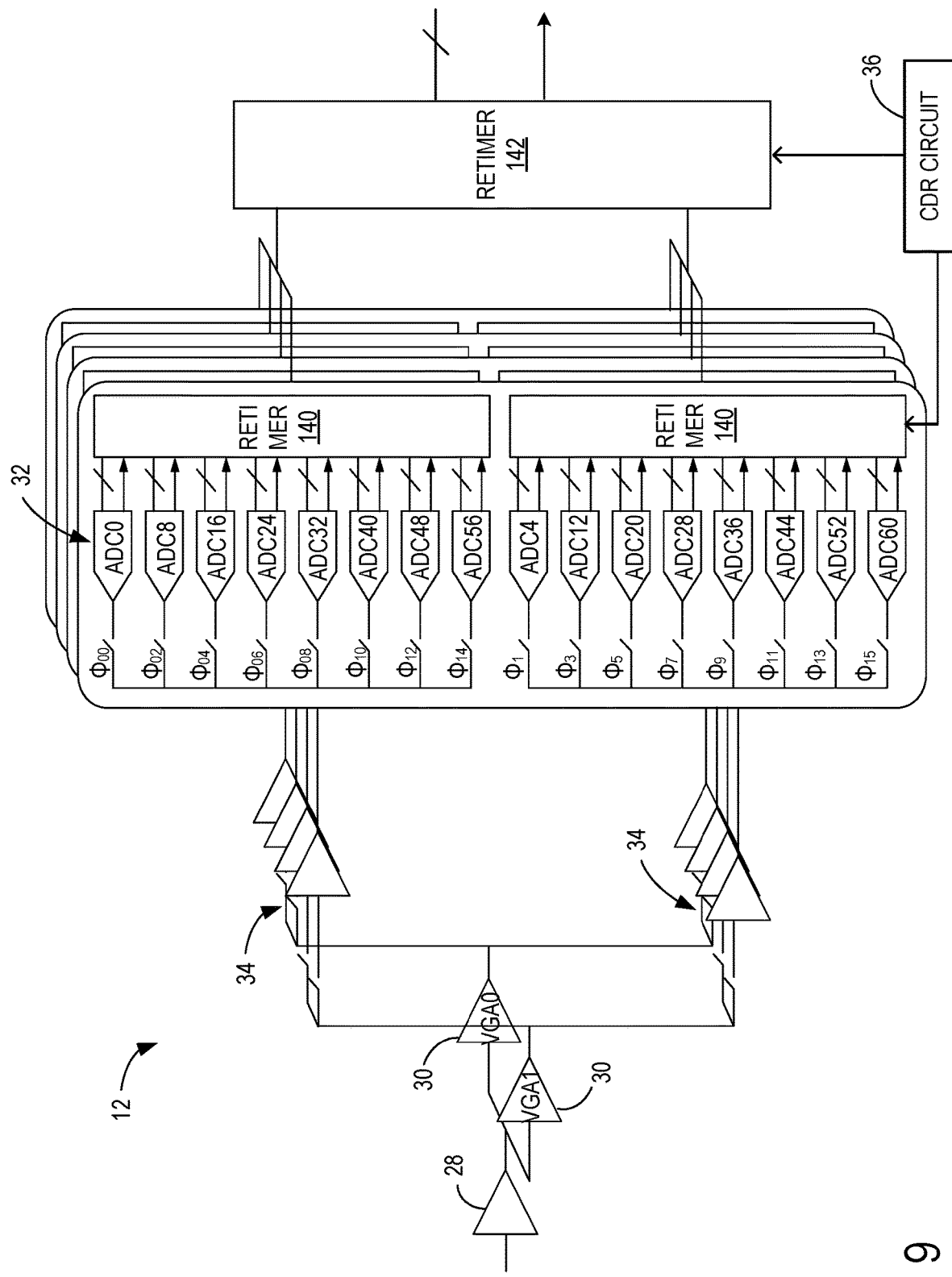
FIG. 9 schematically shows a fanout architecture in which four sets of interleaved ADCs are arranged in two VGA-specific channels.

FIG. 7 illustrates an example of clock pulses generated and output to drive the timing of the VGAs, in the case of two VGAs being provided, labeled VGA0 and VGA1 in the figure. As shown, the clock pulses ping pong, that is, alternate back and forth between VGA0 and VGA1. FIG. 8 illustrates an example of the clock pulses for a first set of 16 ADCs in the 64 ADCs. The remaining ADCs utilize similar clock pulses for their timing. For scale reference, unit intervals of 8UI, 4UI and 2UI and 64UI are labeled. FIG. 9 illustrates four set of 16 ADCs 32 arranged downstream of the two VGAs. It will be appreciated that since the VGAs are driven on a ping pong timing according to the clock signals of FIG. 7, and because the ADCs are driven according to the clock in FIG. 8, that each of the 64 ADCs are driven in successive order, with the even channel and odd channel ADCs alternating the drive order. While ADC0 is illustrated at the top in the first set of ADCs associated with VGA0 (corresponding to the even channel), it will be appreciated that ADC1, ADC2, and ADC3 (hidden in the figure) are respectively provided in different ADC sets associated with VGA0 and VGA1 (corresponding to the odd channel). Retimers 140 are provided downstream of each bank of 8 ADCs in each of the even and odd channels in a 16 ADC set, to re-time the output of the ADCs based on the CDR circuit 36 output. Retimer 142 is provided to synchronize and re-time the signals coming from each of the four sets of ADCs, also based on the CDR circuit 36 output.

Figure 6:
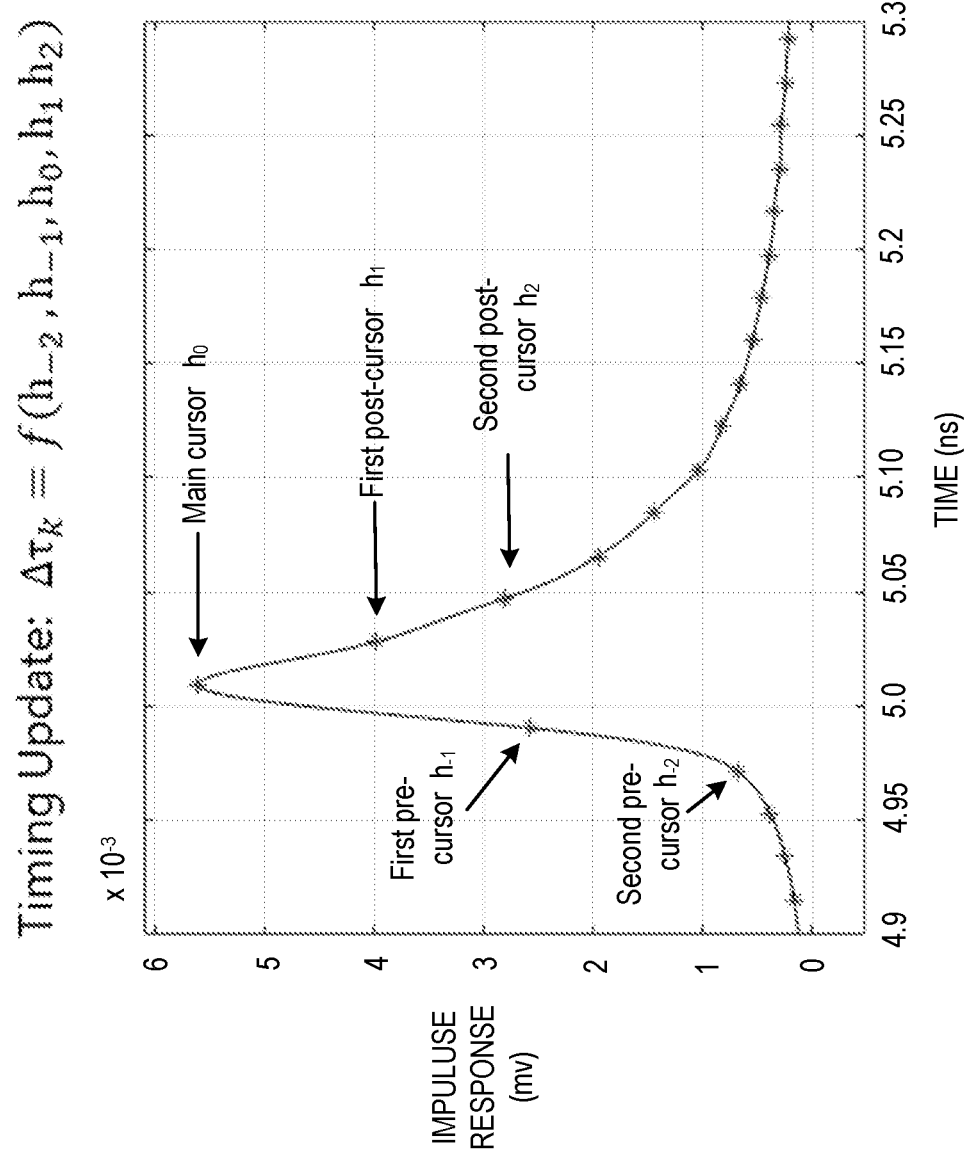
FIG. 6 is a graph of an example impulse response signal utilized by the phase detector of the CDR circuit of FIG. 5, showing a main cursor, two precursors, and two post cursors.

Returning to FIG. 5, the phase detector 40 may operate according to a predetermined timing recovery scheme. One possible timing scheme is a Mueller-Muller timing recovery scheme. The Mueller-Muller timing recovery scheme takes into account one pre-cursor and one post-cursor, as detailed below. Alternatively, for greater accuracy, the phase detector may be a Multiple Pre/Post Cursor Phase detector that takes into account at least two precursor coefficients, a main coefficient, and at least two post cursor coefficients, as detailed below. FIG. 6 illustrates the main cursor, two precursors, and two post cursors in an example impulse response signal.

$\Delta\tau_k = A_{k-1}(x_k - x_{k-2})(\text{Post} = A_{k-1}x_k, \text{Pre} = A_{k-1}x_{k-2})$ Mueller-Muller Phase Detector:

Timing Update: $\Delta\tau_k = f(h_{-2}, h_{-1}, h_0, h_1, h_2)$ Multiple Pre/Post Cursor Phase Detector:

Returning to FIG. 5, the CDR circuit 36 may further include a skew correction module 130, which is configured to correct skew among the samples from the ADCs. It will be appreciated that the multiple sample clock signals may be generated in either a differential timing mode or a common timing mode. In the differential timing mode, differences in the timing among each ADC in a particular VGA-specific channel (even or odd) within a particular set of ADCs are corrected, wherein in the common timing mode, differences between the different sets of ADCs are corrected. Typically, the corrections according to the differential timing mode are implemented at the retimers 140 and corrections for the common timing mode are implemented at the retimer 142. Each of these modes takes both pre-cursor and post-cursor timing errors into consideration in order to correct sample skew. Details for the common mode timing update and differential mode timing update follow.

$$\Delta\tau_k = \Sigma_{i=1}^{NADC} \Delta\tau_{err} \quad \text{Common Mode Timing Update}$$

Figure 10:
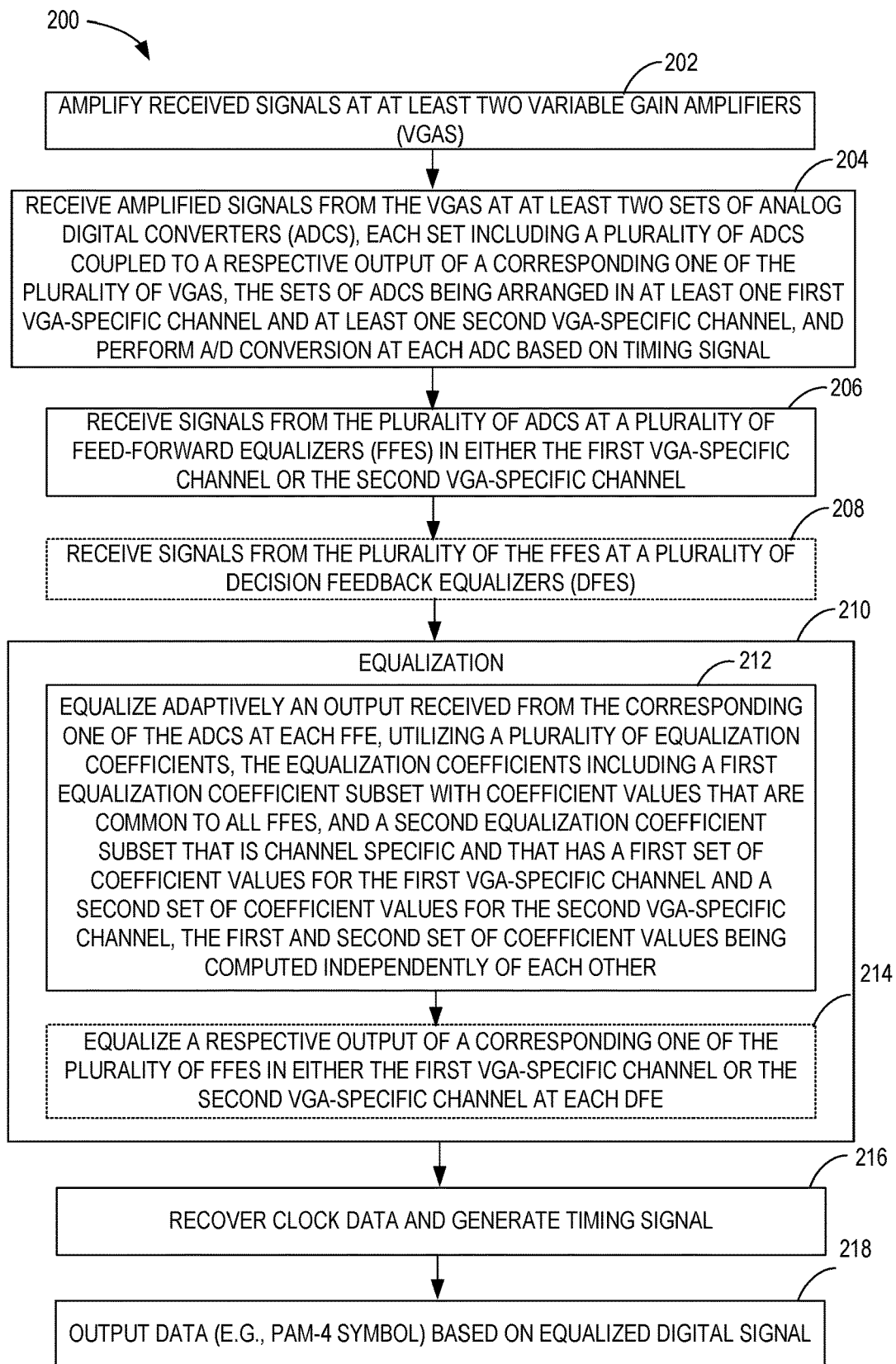
FIG. 10 shows a flowchart of a signal processing method according to one example of the present disclosure.

Timing Update: $[\Delta\tau_k^1, \Delta\tau_k^2, \ldots, \Delta\tau_k^{NS}] = [\Sigma_{i=1,5} {}^{NADC} \Delta\tau_{err}, \Sigma_{i=2,6} {}^{NADC} \Delta\tau_{err}, \ldots, \Sigma_{i=4,8} {}^{NADC} \Delta\tau_{err}]$ Differential Mode Timing Update:

FIG. 10 shows a flowchart of an example signal processing method 200 that may be performed at the receiver 20 of the network transceiver device 20 in FIG. 2. Alternatively, the method 200 may be performed on other suitable hardware. At step 202, the method 200 may include amplifying received signals at at least two variable gain amplifiers (VGAs). At step 204, the method 200 may further include receiving amplified signals from the VGAs at at least two sets of analog digital converters (ADCs), and performing analog digital conversion at each ADC according to a timing signal received from the CDR circuit, as discussed below. Each set includes a plurality of ADCs coupled to a respective output of a corresponding one of the plurality of VGAs. The sets of ADCs may be arranged in at least one first VGA-specific channel, such as the even channel discussed above, and at least one second VGA-specific channel, such as the odd channel discussed above. At step 206, the method 200 may further include receiving signals from the plurality of ADCs at a plurality of feed-forward equalizers (FFEs) in either the first VGA-specific channel or the second VGA-specific channel. At step 208, the method 200 may further include receiving signals from the plurality of the FFEs at a plurality of decision feedback equalizers (DFEs). At 210, the method may include equalizing the output of the ADCs using the FFE, DFE and/or MLSE equalization discussed above, to generate an equalized digital signal, which may contain PAM-4 encoded data. To achieve this equalization at 210, at step 212, the method 200 may further include equalizing adaptively an output received from the corresponding one of the ADCs at each FFE, utilizing a plurality of equalization coefficients. The equalization coefficients may include a first equalization coefficient subset with coefficient values that are common to all FFEs, and a second equalization coefficient subset that is channel specific and that has a first set of coefficient values for the first VGA-specific channel and a second set of coefficient values for the second VGA-specific channel. The first and second set of coefficient values are computed independently of each other. At step 214, the method 200 may further include equalizing a respective output of a corresponding one of the plurality of FFEs in either a VGA-specific channel, for example an even channel or an odd channel, at each DFE. Though not shown in detail in FIG. 10, the method may also include performing MLSE equalization, as discussed above. Following equalization, at step 216, the method 200 may further include recovering clock data and generating a timing signal based thereon, which is fed to control timing of the ADCs. Example substeps that may be performed to accomplish step 216 are discussed below in relation to FIG. 11. Finally, at step 218, the method 200 may further include outputting data, e.g., a PAM-4 symbol or data contained within a PAM-4 symbol, based on the equalized digital signal.

Figure 11:
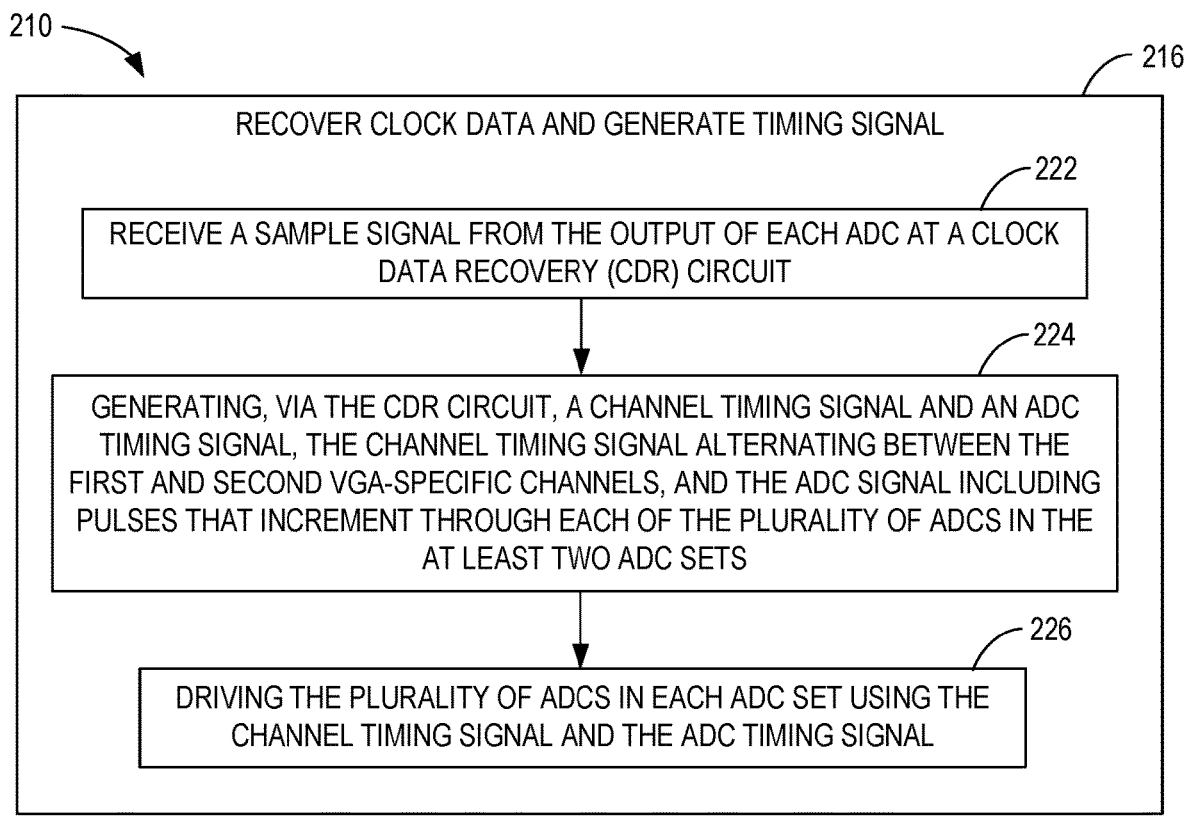
FIG. 11 shows additional steps of the method of FIG. 10.

FIG. 11 shows a flowchart of an example substeps of step 216 of the signal processing method 220 of FIG. 10, which may be performed at the clock data recovery (CDR) circuit 36 of the network transceiver device 20 in FIG. 2, or using other suitable hardware. At step 222, the method may include receiving a sample signal from the output of each ADC at a clock data recovery (CDR) circuit. At step 224, the method may further include generating, via the CDR circuit, a channel timing signal and an ADC timing signal, the channel timing signal alternating between a first VGA-specific channel and a second VGA-specific channel, e.g., between even and odd channels corresponding to the at least two VGAs, as shown in FIG. 7. The ADC signal may include pulses that increment through each of the plurality of ADCs in the at least two ADC sets, as shown in FIG. 8. At step 226, the method may further include driving the plurality of ADCs in each ADC set using the channel timing signal and the ADC timing signal, which results in the interleaved ADC sequence discussed above.

The above systems and methods may be implemented to achieve increased throughput in a network transceiver device, while addressing gain mismatch and bandwidth mismatch that can occur from using an ADC fanout architecture including multiple parallel VGA channels. In particular, such an approach is believed to be applicable to achieve data transmission rates of 112 Gbps and higher using PAM-4 encoding, although it may also be applied to lower transmission rates if desired.

The computing devices 16 described above may be any suitable computing device, including a processor, volatile memory, and non-volatile memory, and instructions as software or firmware for example, stored in such memory, and executable via the processor to achieve the functions described herein, and may take the form of desktops, laptops, servers, routers, switches, network appliances, tablet computers, smartphones, etc. The network transceiver devices 12 described above may be integrated within the housings of the computing devices and connected via an interconnect to a I/O board, motherboard, daughterboard etc., of such devices. In some particular configurations, the network transceiver device may be an ethernet card, network transceiver module, network adaptor, or similar device.

The following paragraphs discuss several aspects of the present disclosure. According to one aspect of the present disclosure, a network transceiver device is provided. The network transceiver device may include at least two variable gain amplifiers (VGAs) configured to amplify received signals. The network transceiver device may further include at least two sets of analog digital converters (ADCs), each set including a plurality of ADCs coupled to a respective output of a corresponding one of the plurality of VGAs, the sets of ADCs being arranged in at least a first VGA-specific channel and at least a second VGA-specific channel. The network transceiver device may further include a plurality of feed-forward equalizers (FFEs), each FFE being coupled to receive a respective output of a corresponding one of the plurality of ADCs in either the first VGA-specific channel or the second VGA-specific channel, each FFE being configured to adaptively equalize the output received from the corresponding one of the ADCs utilizing a plurality of equalization coefficients, the equalization coefficients including a first equalization coefficient subset with coefficient values that are common to all FFEs, and a second equalization coefficient subset that is channel specific and that has a first set of coefficient values for the first VGA-specific channel and a second set of coefficient values for the second VGA-specific channel, the first and second set of coefficient values being computed independently of each other.

According to this aspect, the network transceiver device may further include a Continuous Time Linear Equalizer (CTLE) coupled on input side of the plurality of the VGAs.

According to this aspect, the network transceiver device may further include a plurality of decision feedback equalizers (DFEs), each DFE being coupled to receive a respective output of a corresponding one of the plurality of FFEs in either the first VGA-specific channel or the second VGA-specific channel.

According to this aspect, the network transceiver device may further include a clock data recovery (CDR) circuit coupled on an input side and an output side of the plurality of the ADCs. The CDR circuit is configured to receive ADC sample signal from the output of each ADC and in response thereto, to generate a channel timing signal and an ADC timing signal, the channel timing signal alternating between the first VGA-specific channel and the second VGA-specific channel, and the ADC signal including pulses that increment through each of the plurality of ADCs in the at least two ADC sets.

According to this aspect, the CDR circuit may include a phase detector configured to detect a phase of a signal received from each of the ADCs, wherein the phase detector of the CDR circuit is configured to determine a timing of an impulse response in the received signal from the ADC utilizing at least two precursor coefficients, a main coefficient, and at least two post cursor coefficients.

According to this aspect, the network transceiver device may further include a maximum likelihood sequence estimation (MLSE) equalizer coupled on output side of the plurality of the DFEs, the MLSE equalizer being configured to correct DFE burst errors in each of the plurality of DFEs.

According to this aspect, the network transceiver device may be configured to operate as a four-level pulse-amplitude modulated (PAM-4) transceiver.

According to this aspect, the first set of coefficient values and second set of coefficient values may differ in value from each other.

According to this aspect, the first set of coefficient values and second set of coefficient values may be computed to minimize a squared error associated with an ADC sample of analog input signal.

According to this aspect, the squared error may be computed based on a formula of $$e_k^2 = \left[ EQTARG[d_k] - \left( \sum_{m=0}^{nffe} hffe_m ADC_{k-m} - \sum_{i=1}^{m} hdfe_i d_{k-i} \right) \right]^2$$

and
$hffe_m$ is an FFE coefficient;
$hdfe_i$ is a DFE coefficient;
$ADC_k$ is a $k^{th}$ ADC sample;
$ADC_{k-m}$ is an ADC sample corresponding to (k-m)th input signal sample;

$EQTARG[d_k]$ is an equalization target for the FFE equalization;
$d_k$ is an output of the DFE data slicer at time interval k;
$d_{k-i}$ is an output of the DFE data slicer at time interval k-i;
m is an index of FFE coefficients; and
n is a number of DFE taps.

According to this aspect, the at least two sets of analog ADCs, may include four sets of ADCs, with 16 ADCs included in each of the four sets.

According to another aspect of the present disclosure, a signal processing method is provided. The signal processing method may include amplifying received signals at at least two variable gain amplifiers (VGAs). The signal processing method may further include receiving amplified signals from the VGAs at at least two sets of analog digital converters (ADCs), each set including a plurality of ADCs coupled to a respective output of a corresponding one of the plurality of VGAs, the sets of ADCs being arranged in at least one first VGA-specific channel and at least one second VGA-specific channel. The signal processing method may further include receiving signals from the plurality of ADCs at a plurality of feed-forward equalizers (FFEs) in either the first VGA-specific channel or the second VGA-specific channel. The signal processing method may further include equalizing adaptively an output received from the corresponding one of the ADCs at each FFE, utilizing a plurality of equalization coefficients, the equalization coefficients including a first equalization coefficient subset with coefficient values that are common to all FFEs, and a second equalization coefficient subset that is channel specific and that has a first set of coefficient values for the first VGA-specific channel and a second set of coefficient values for the second VGA-specific channel, the first and second set of coefficient values being computed independently of each other.

According to this aspect, the signal processing method may further include receiving signals from the plurality of the FFEs at a plurality of decision feedback equalizers (DFEs). The signal processing method may further include equalizing a respective output of a corresponding one of the plurality of FFEs in either the first VGA-specific channel or the second VGA-specific channel at each DFE.

According to this aspect, the signal processing method may further include receiving a sample signal from the output of each ADC at a clock data recovery (CDR) circuit. The signal processing method may further include generating, via the CDR circuit, a channel timing signal and an ADC timing signal, the channel timing signal alternating between the first VGA-specific channel and the second VGA-specific channel, and the ADC signal including pulses that increment through each of the plurality of ADCs in the at least two ADC sets. The signal processing method may further include driving the plurality of ADCs in each ADC set using the channel timing signal and the ADC timing signal.

According to this aspect, the CDR circuit may include a phase detector configured to detect a phase of a signal received from each of the ADCs. The phase detector of the CDR circuit may be configured to determine a timing of an impulse response in the received sample signal from the ADC utilizing at least two precursor coefficients, a main coefficient, and at least two post cursor coefficients.

According to this aspect, the signal processing method may be performed in a four-level pulse-amplitude modulated (PAM-4) transceiver.

According to this aspect, the first set of coefficient values and second set of coefficient values may differ in value from each other.

According to this aspect, the first and second set of coefficient values may be computed to minimize a squared error an ADC sample of analog input signal.

According to this aspect, the squared error may be computed based on a formula of $$e_k^2 = \left[EQTARG[d_k] - \left(\sum_{m=0}^{nffe} hffe_m ADC_{k-m} - \sum_{i=1}^{m} hdfe_i d_{k-i}\right)\right]^2$$

and
- $hffe_m$ is an FFE coefficient;
- $hdfe_i$ is a DFE coefficient;
- $ADC_k$ is a $k^{th}$ ADC sample;
- $ADC_{k-m}$ is an ADC sample corresponding to (k-m)th input signal sample;
- $EQTARG[d_k]$ is an equalization target for the FFE equalization;
- $d_k$ is an output of the DFE data slicer at time interval k;
- $d_{k-i}$ is an output of the DFE data slicer at time interval k-i;
- m is an index of FFE coefficients; and
- n is a number of DFE taps.

According to another aspect of the present disclosure, a network transceiver device is provided. The network transceiver device may include at least two variable gain amplifiers (VGAs) configured to amplify received signals. The network transceiver device may further include at least two sets of analog digital converters (ADCs), each set including a plurality of ADCs coupled to a respective output of a corresponding one of the plurality of VGAs, the sets of ADCs being arranged in at least a first VGA-specific channel and at least a second VGA-specific channel. The network transceiver device may further include a plurality of feed-forward equalizers (FFEs), each FFE being coupled to receive a respective output of a corresponding one of the plurality of ADCs in either the first VGA-specific channel or the second VGA-specific channel, each FFE being configured to adaptively equalize the output received from the corresponding one of the ADCs utilizing one or more VGA-specific channel equalization coefficients.

According to another aspect of the present disclosure, a network transceiver device is provided. The network transceiver device may include at least two variable gain amplifiers (VGAs) configured to amplify received signals. The network transceiver device may further include at least two sets of analog digital converters (ADCs), each set including a plurality of ADCs coupled to a respective output of a corresponding one of the plurality of VGAs, the sets of ADCs being arranged in at least a first VGA-specific channel and a second VGA-specific channel. The network transceiver device may further include a clock data recovery (CDR) circuit coupled to each of the plurality of ADCs, wherein the CDR circuit is configured to receive an ADC sample signal from each of the plurality of ADCs, and in response is configured to generate a channel timing signal and an ADC timing signal, the channel timing signal alternating between the first VGA-specific channel and the second VGA specific channel, and the ADC timing signal including pulses that increment through each of the plurality of ADCs in the at least two sets of ADCs.

According to this aspect, each CDR circuit may include a phase detector configured to detect a phase of a signal received from each of the ADCs.

According to this aspect, the network transceiver device may further include the phase detector of each CDR circuit is configured to determine a timing of an impulse response in the received signal from the ADC utilizing at least two precursor coefficients, a main coefficient, and at least two post cursor coefficients.

According to this aspect, the network transceiver device may further include a skew correction module configured to correct skew among samples from the ADCs taking into consideration both pre-cursor and post-cursor timing errors in order to correct sample skew.

According to this aspect, the skew correction module may operate in either a differential timing mode or a common timing mode.

According to this aspect, in the differential timing mode, differences in the timing among each ADC in a particular VGA-specific channel within each of the at least two sets of ADCs may be corrected.

According to this aspect, in the common timing mode, differences between the at least two sets of ADCs may be corrected.

According to this aspect, the network transceiver device may further include a plurality of feed-forward equalizers (FFEs), each FFE being coupled to receive a respective output of a corresponding one of the plurality of ADCs in either the first VGA-specific channel or the second VGA-specific channel, each FFE being configured to adaptively equalize the output received from the corresponding one of the ADCs utilizing a plurality of equalization coefficients, the equalization coefficients including a first equalization coefficient subset with coefficient values that are common to all FFEs, and a second equalization coefficient subset that is channel specific and that has a first set of coefficient values for the first VGA-specific channel and a second set of coefficient values for the second VGA-specific channel, the first and second set of coefficient values being computed independently of each other.

According to this aspect, the first set of coefficient values and second set of coefficient values may differ in value from each other.

According to this aspect, the first and second set of coefficient values may be computed to minimize a squared error associated with an ADC sample of analog input signal.

According to this aspect, the network transceiver device may be configured to operate as a four-level pulse-amplitude modulated (PAM-4) transceiver.

According to another aspect of the present disclosure, a signal processing method is provided. The signal processing method may include amplifying received signals at at least two variable gain amplifiers (VGAs). The signal processing method may further include receiving amplified signals from the VGAs at at least two sets of analog digital converters (ADCs), each set including a plurality of ADCs coupled to a respective output of a corresponding one of the plurality of VGAs, the sets of ADCs being arranged in at least one first VGA-specific channel and at least one second VGA-specific channel. The signal processing method may further include receiving an ADC sample signal from each of the plurality of ADCs at a clock data recovery (CDR) circuit coupled to each of the plurality of ADCs, and in response generating a channel timing signal and an ADC timing signal, the channel timing signal alternating between the first VGA-specific channel and the second VGA specific channel, and the ADC timing signal including pulses that increment through each of the plurality of ADCs in the at least two sets of ADCs.

According to this aspect, each CDR circuit may include a phase detector configured to detect a phase of a signal received from each of the plurality of ADCs.

According to this aspect, the signal processing method may further include determining a timing of an impulse response in the received signal from the ADC utilizing at least two precursor coefficients, a main coefficient, and at least two post cursor coefficients, using the phase detector of each CDR circuit.

According to this aspect, the signal processing method may further include correcting skew among samples from the ADCs taking into consideration both pre-cursor and post-cursor timing errors in order to correct sample skew, using a skew correction module.

According to this aspect, the skew correction module may operate in either a differential timing mode or a common timing mode.

According to this aspect, in the differential timing mode, differences in the timing among each ADC in a particular VGA-specific channel within each of the at least two sets of ADCs may be corrected.

According to this aspect, in the common timing mode, differences between the at least two sets of ADCs may be corrected.

According to this aspect, the signal processing method may further include equalizing the output of the plurality of ADCs, to generate an equalized digital signal.

According to this aspect, the signal processing method may further include outputting data including a PAM-4 symbol or data contained within a PAM-4 symbol, based on the equalized digital signal.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A network transceiver device, comprising:
a plurality of variable gain amplifiers (VGAs) configured to amplify received signals;
at least two sets of analog digital converters (ADCs), each set including a plurality of ADCs coupled to a respective output of a corresponding one of the plurality of VGAs, wherein a first set of the at least two sets of ADCs is arranged in at least a first VGA-specific channel and a second set of the at least two sets of ADCs is arranged in at least a second VGA-specific channel; and
a plurality of feed-forward equalizers (FFEs), each FFE being coupled to receive a respective output of a corresponding ADC of the at least two sets of ADCs in either the first VGA-specific channel or the second VGA-specific channel, each FFE being configured to adaptively equalize the output received from the corresponding ADC utilizing a plurality of equalization coefficients, the plurality of equalization coefficients including a first equalization coefficient subset with coefficient values that are common to all FFEs, and a second equalization coefficient subset that is channel specific and that has a first set of coefficient values for the first VGA-specific channel and a second set of coefficient values for the second VGA-specific channel, the first and second set of coefficient values being computed independently of each other.

2. The network transceiver device of claim 1, comprising:
a Continuous Time Linear Equalizer (CTLE) coupled on an input side of the plurality of the VGAs.

3. The network transceiver device of claim 1, comprising:
a plurality of decision feedback equalizers (DFEs), each DFE being coupled to receive a respective output of a corresponding one of the plurality of FFEs in either the first VGA-specific channel or the second VGA-specific channel.

4. The network transceiver device of claim 3, comprising:
a maximum likelihood sequence estimation (MLSE) equalizer coupled on an output side of the plurality of the DFEs, the MLSE equalizer being configured to correct DFE burst errors in each of the plurality of DFEs.

5. The network transceiver device of claim 1, comprising:
a clock data recovery (CDR) circuit coupled on an input side and an output side of the plurality of the ADCs, wherein the CDR circuit is configured to receive an ADC sample signal from the output of each ADC and in response thereto, to generate a channel timing signal and an ADC timing signal, the channel timing signal alternating between the first VGA-specific channel and the second VGA-specific channel, and the ADC timing signal including pulses that increment through each of the plurality of ADCs in the at least two ADC sets.

6. The network transceiver device of claim 5, wherein the CDR circuit includes a phase detector configured to detect a phase of a signal received from each of the plurality of ADCs, wherein the phase detector of the CDR circuit is configured to determine a timing of an impulse response in the received signal from each ADC of the plurality of ADCs utilizing at least two precursor coefficients, a main coefficient, and at least two post cursor coefficients.

7. The network transceiver device of claim 1,
wherein the network transceiver device is configured to operate as a four-level pulse-amplitude modulated (PAM-4) transceiver.

8. The network transceiver device of claim 1,
wherein the first set of coefficient values and second set of coefficient values differ in value from each other.

9. The network transceiver device of claim 1,
wherein the first and second set of coefficient values are computed to minimize a squared error associated with an ADC sample of an analog input signal.

10. The network transceiver device of claim 1,
wherein the at least two sets of ADCs includes four sets of ADCs, with 16 ADCs included in each of the four sets.

11. A signal processing method, comprising:
amplifying received signals at a plurality of variable gain amplifiers (VGAs);
receiving amplified signals from the plurality of VGAs at each set of at least two sets of analog digital converters (ADCs), each set including a plurality of ADCs coupled to a respective output of a corresponding one of the plurality of VGAs, wherein a first set of the at least two sets of ADCs is arranged in at least a first VGA-specific channel and a second set of the at least two sets of ADCs is arranged in at least a second VGA-specific channel;
receiving signals from the plurality of ADCs in each set of the at least two sets of ADCs at a plurality of feed-forward equalizers (FFEs) in either the first VGA-specific channel or the second VGA-specific channel; and equalizing adaptively an output received from a corresponding ADC of the at least two sets of ADCs at each FFE, utilizing a plurality of equalization coefficients, the plurality of equalization coefficients including a first equalization coefficient subset with coefficient values that are common to all FFEs, and a second equalization coefficient subset that is channel specific and that has a first set of coefficient values for the first VGA-specific channel and a second set of coefficient values for the second VGA-specific channel, the first and second set of coefficient values being computed independently of each other.

12. The method of claim 11, further comprising:

receiving signals from the plurality of the FFEs at a plurality of decision feedback equalizers (DFEs); and equalizing a respective output of a corresponding one of the plurality of FFEs in either the first VGA-specific channel or the second VGA-specific channel at each DFE.

13. The method of claim 11, further comprising:

receiving a sample signal from the output of each ADC of the at least two sets of ADCs at a clock data recovery (CDR) circuit;

generating, via the CDR circuit, a channel timing signal and an ADC timing signal, the channel timing signal alternating between the first VGA-specific channel and the second VGA-specific channel, and the ADC timing signal including pulses that increment through each ADC of the plurality of ADCs in each set of the at least two sets of ADCs; and driving the plurality of ADCs in each set of the at least two sets of ADCs using the channel timing signal and the ADC timing signal.

14. The method of claim 13, wherein the CDR circuit includes a phase detector configured to detect a phase of a signal received from each ADC of the at least two sets of ADCs, wherein the phase detector of the CDR circuit is configured to determine a timing of an impulse response in the received sample signal from each ADC utilizing at least two precursor coefficients, a main coefficient, and at least two post cursor coefficients.

15. The method of claim 11, wherein the signal processing method is performed in a four-level pulse-amplitude modulated (PAM-4) transceiver.

16. The method of claim 11, wherein the first set of coefficient values and second set of coefficient values differ in value from each other.

17. The method of claim 11, wherein the first and second set of coefficient values are computed to minimize a squared error associated with an ADC sample of analog input signal.

* * * * *